United States Patent
Hoefsmit

(10) Patent No.: US 7,312,526 B2
(45) Date of Patent: Dec. 25, 2007

(54) SEMICONDUCTOR DEVICE AND METHOD OF MANUFACTURING THEREOF

(75) Inventor: Jozeph Peter Karl Hoefsmit, Stadskanaal (NL)

(73) Assignee: NXP B.V., Eindhoven (NL)

( * ) Notice: Subject to any disclaimer, the term of this patent is extended or adjusted under 35 U.S.C. 154(b) by 304 days.

(21) Appl. No.: 10/530,304

(22) PCT Filed: Sep. 18, 2003

(86) PCT No.: PCT/IB03/04134

§ 371 (c)(1),
(2), (4) Date: Apr. 4, 2005

(87) PCT Pub. No.: WO2004/032233

PCT Pub. Date: Apr. 15, 2004

(65) Prior Publication Data

US 2007/0096301 A1 May 3, 2007

(51) Int. Cl.
H01L 23/10 (2006.01)
H01L 21/44 (2006.01)
(52) U.S. Cl. ............ 257/706; 257/707; 257/720; 438/122; 438/124
(58) Field of Classification Search .......... 438/122, 438/124, 127; 257/706, 707, 720
See application file for complete search history.

(56) References Cited

U.S. PATENT DOCUMENTS 5,972,737 A * 10/1999 Polese et al. ............ 438/122
6,249,433 B1 * 6/2001 Huang et al. ............ 361/704
2004/0042153 A1 * 3/2004 Sun ......................... 361/274.3

* cited by examiner

Primary Examiner—Hsien-Ming Lee
(74) Attorney, Agent, or Firm—Peter Zawilski

(57) ABSTRACT

The invention relates to a semiconductor device (10) comprising an electrically conductive bottom plate (1) on an upper side of which a semiconductor element (2) is positioned with a first connection region and a second connection region and with a first conductor and a second conductor, part of which is connected to, respectively, the first and the second connection region of the semiconductor element (2), the semiconductor element (2) and the parts of the conductors connected to the semiconductor element (2) being provided with an electrically insulating resin encapsulation (4) that covers a side face of the bottom plate (1), and the side face of the bottom plate (1) being provided, at the bottom face of the bottom plate (1), with a cavity (5) which is filled with a part of the encapsulation (4). According to the invention, the cavity (5), viewed in a direction transverse and perpendicular to the edge of the bottom plate (1), has the form of a staircase with to steps. In this way it is achieved that during the formation of the encapsulation (4), which at this stage is still liquid, said encapsulation (4) overflows a part of the bottom face of the bottom plate (1). Thus, the resulting device (10) can be mounted flat and with excellent heat sink capability of the bottom plate (1). Preferably, the semiconductor device (2) comprises a discrete power device such as a (LD)MOSFET. The invention further comprises a cheap and easy way of manufacturing a device according to the invention.

15 Claims, 4 Drawing Sheets

SEMICONDUCTOR DEVICE AND METHOD OF MANUFACTURING THEREOF

Figure 1:
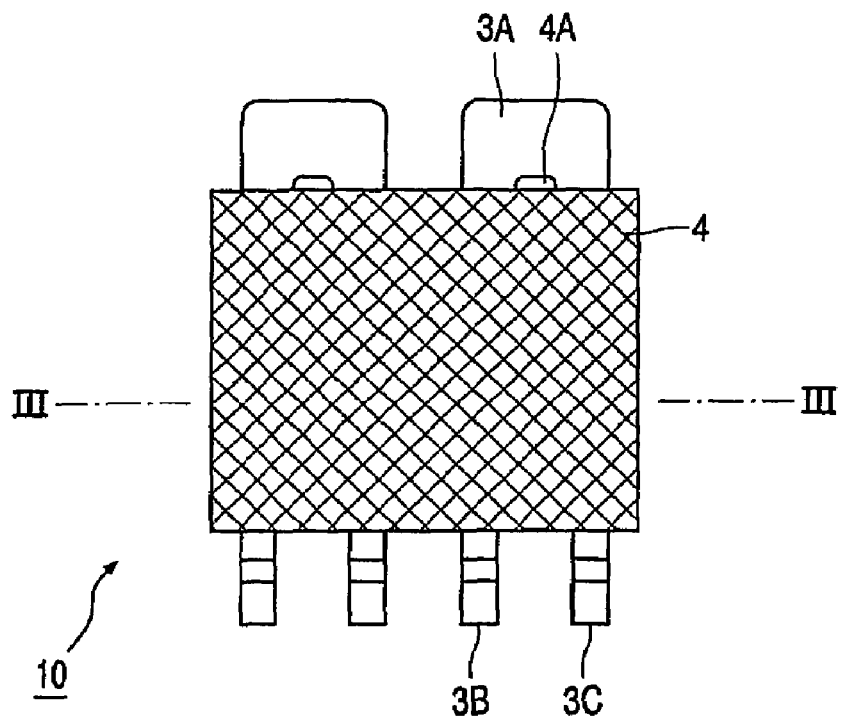

The invention relates to a semiconductor device comprising a thermally and electrically conductive bottom plate on an upper side of which there is a semiconductor element with a first connection region and a second connection region, said regions being coupled to, respectively a first conductor and a second conductor, said semiconductor element being surrounded by an electrically insulating synthetic resin envelope that covers a side face of the bottom plate, which side face is provided with a recess that is filled with a part of the envelope.

The invention also relates to a method of manufacturing of such a semiconductor device.

A semiconductor device of the type mentioned in the opening paragraph is known from patent specification WO 99/67821. Said document discloses a semiconductor device comprising a conductive plate and a number of conductors, said conductive plate and said conductors being formed simultaneously in a so termed conductor frame. The conductive plate supports a semiconductor element, in this case an IC (=Integrated Circuit), which is secured to the bottom plate, and the connection regions of the IC are connected to the conductors by means of wire connections. The semiconductor element and the wire connections are covered or surrounded by an electrically insulating envelope of a synthetic resin material. The envelope covers a side face of the bottom plate and projects into a recess situated on the lower side of said side face. This device is comparatively compact because no part of the envelope is situated below the bottom plate.

A drawback of the known device resides in that in the course of the manufacture thereof sometimes a part of the synthetic resin envelope does end up on the lower side of the bottom plate. This constitutes a drawback, most notably, if the semiconductor element is, in particular, a discrete power element and the bottom plate serves as a so-termed heat sink. Particularly a flat lower side of the device is very important to enable final assembly of the device such that a good thermal performance is obtained.

Therefore, it is an object of the invention to provide a semiconductor device of the type mentioned in the opening paragraph, wherein said drawback is absent or at least substantially reduced, and which semiconductor device can be manufactured without a part of the envelope extending over the lower side of the bottom plate, so that a good heat sink effect after final assembly of the device is obtained.

To achieve this, a semiconductor device of the type mentioned in the opening paragraph is characterized in accordance with the invention in that the recess, viewed in cross-section at right angles to the edge of the bottom plate, takes the form of a staircase with at least two steps. The staircase preferably has two steps. The invention is based on the surprising recognition that, by virtue thereof, in the course of the manufacture of the envelope (substantially) no part of the envelope ends up on the lower side of the bottom plate. In the known device, when the envelope is provided from above (the envelope still being liquid at that stage), said envelope penetrates into the recess of the bottom plate which, in this process step, is situated on a support plate, and also into the slit-shaped interspace between the lower side of the bottom plate and the upper side of the support plate. As the recess in the semiconductor device in accordance with the invention takes the form of a staircase with two or more steps, the following occurs: on the outside, at the location of the upper step of the staircase, the envelope readily flows into the recess, cools only slowly and, after it has eventually solidified, is firmly anchored on the bottom plate. At the location of the first step of the staircase, the distance over which the liquid envelope can flow under the bottom plate is larger. However, as the recess is lower there, the resistance is higher, and the liquid envelope will flow more slowly. As a result, the envelope in that part of the recess will solidify sooner. This effect is further enhanced by the two following aspects: in the first place, in the lower part of the recess, the cooling surface per quantity of envelope is larger, and secondly, in the lower part, the heat content of the liquid envelope present there is smaller. Said two factors also contribute to a rapid solidification of the envelope in said lower part. As a result, it is precluded that liquid envelope penetrates between the supporting plate and the bottom plate.

Several embodiments are envisaged to provide the conductors. The conductors may be provided in the same plane as the bottom plate, and being connected to the connection regions with bond wires. The conductors may also be provided in planes at opposite sides of the semiconductor element, wherein the bottom plate is used as the first conductor. In this case, the semiconductor element may be a diode.

The conductors may also be provided at a side of the semiconductor element opposite to that at which the bottom plate is located, and form part of an assembly. At least part of the conductors is then coupled to, respectively, the first and the second connection region, which parts are also being surrounded by an electrically insulating synthetic resin envelope. This solution is preferred for power applications, as such an assembly allows large currents and powers to be flowing to the semiconductor element. It is herein not excluded that the semiconductor element is provided with more than two connection regions and that there are more than two corresponding conductors. It is furthermore not excluded that such conductors are interconnected again to the opposite side, so as to provide a device that has all contacts at a single side and is thus surface mountable.

The term 'assembly' should be understood, in the context of this application, as a number of elements that are mechanically attached into a single construction and that can be formed integrally, in particular from one conductive plate. Preferably, the shapes of the elements is designed such that it is clear that they are constructed as a whole, even if they are mutually isolated by the synthetic resin envelope.

Very good results are achieved if the height of the recess at the location of the first step lies in the range between 20 and 60 μm and at the location of the second step in the range between 100 and 150 μm. The width of the steps preferably ranges between 0.2 and 0.4 mm. The thickness of the bottom plate preferably is about 250 μm.

In a preferred embodiment, the device of the invention comprises a further electrically conductive bottom plate that is separated from the bottom plate and on which a further semiconductor element is situated having a first and a second further connection region, said regions being coupled to, respectively a first further conductor and a second further conductor, said further semiconductor element being surrounded by the electrically insulating synthetic resin envelope that is connected to the further bottom plate in a way similar to the manner in which it is connected to the bottom plate. Particularly with such a device, wherein each bottom plate has relatively small dimensions, the advantage of a good thermal/heat sink effect of each bottom plates is very important. In addition, the use of, in particular two, discrete power elements was found to yield surprising advantages in practice. For example, a single module can fulfill a function at two different locations in a circuit, for example on a PCB (=Printed Circuit Board). Each semiconductor element is then provided with its proper individual set of (connection) conductors. As a result, the semiconductor elements can be arranged in parallel, in series or otherwise, also if they are used at a single location within the circuit. This constitutes an important advantage in many applications. The two elements are preferably the same, which is however not necessarily the case.

In a further embodiment hereof, the first and second further conductor are part of the assembly, of which part is coupled to the further semiconductor elements, said part also being surrounded by the resin envelope. This has advantages for the manufacture, and is suitable for power applications.

The invention is advantageous, in particular, if the semiconductor element constitutes a discrete power element. An example of such a discrete power element is a MOSFET (=Metal Oxide Semiconductor Field Effect Transistor) in particular of the so-termed LD (=Laterally Diffused) type, wherein the drain of the transistor is situated on the lower side of the semiconductor body of the semiconductor element, and the source and the gate of the transistor are situated on opposite sides. Therefore, such a device constitutes a preferred embodiment wherein the connection region of the drain of the MOSFET borders on the bottom plate that projects from the envelope and that forms the drain connection, the connection regions of the source and the gate of the MOSFET are situated on a side of the MOSFET opposite the connection region of the drain, and the first and the second conductor constitute, respectively, the source and the gate connection and project from the envelope.

To make sure that the bottom plate(s) can suitably be used as a heat sink, they are preferably made of copper. For the solder paste of the element on the bottom plate use can be made of SnPbAg (composition 10/88/2) or SnPb (composition 5/95).

Such a device, particularly in the embodiment for the power discrete elements is suitably manufactured in the method of the invention, which comprises the steps of:

providing an electrically conductive bottom plate having an upper side and a lower side, and a side face, at which side face a recess is present, with its lower side on a support plate;

securing a semiconductor element on the upper side of the bottom plate, which semiconductor element is provided with a first connection region and a second connection region;

providing an assembly of a first conductor and a second conductor, such that a part thereof is coupled to, respectively, the first and the second connection region, surrounding the semiconductor element and the parts of the conductors coupled thereto by an electrically insulating synthetic resin envelope, such that it covers also the side face of the bottom plate and that it projects above the support plate in the recess, and removing the support plate.

This method is characterized in that the recess of the bottom plate has or is given the shape of a staircase with at least two steps, when viewed in a direction transverse and perpendicular to the edge of the bottom plate. As explained hereabove, this leads to devices which have a flat lower side that is free of parts of the synthetic resin envelope, and it is very suitable for power elements.

Preferably, the recess is formed by means of a punch technique. This enables the desired staircase form with two steps to be readily, accurately and economically formed in the bottom plate.

In a particularly advantageous modification of a method in accordance with the invention, the assembly of conductors and the bottom plate is formed from two conductor frames, one of which comprises the bottom plate and a conductor, and the other one of which comprises another conductor, and after securing the semiconductor element to the bottom plate in one conductor frame, the other conductor frame is secured to the semiconductor element, after which the envelope is provided and superfluous parts of the second conductor frames are removed. Such a method has the advantage that also the conductor(s) situated on top of the semiconductor element can be comparatively thick and comparatively wide. This is very advantageous, in particular, if for the semiconductor element use is made of a power element because, in this manner, in addition to a small connection resistance, also a certain degree of cooling on the upper side of the element is achieved.

Preferably, a (LD)MOSFET transistor is chosen as the semiconductor element.

These and other aspects of the invention are apparent from and will be elucidated with reference to the embodiment(s) described hereinafter.

Figure 2:
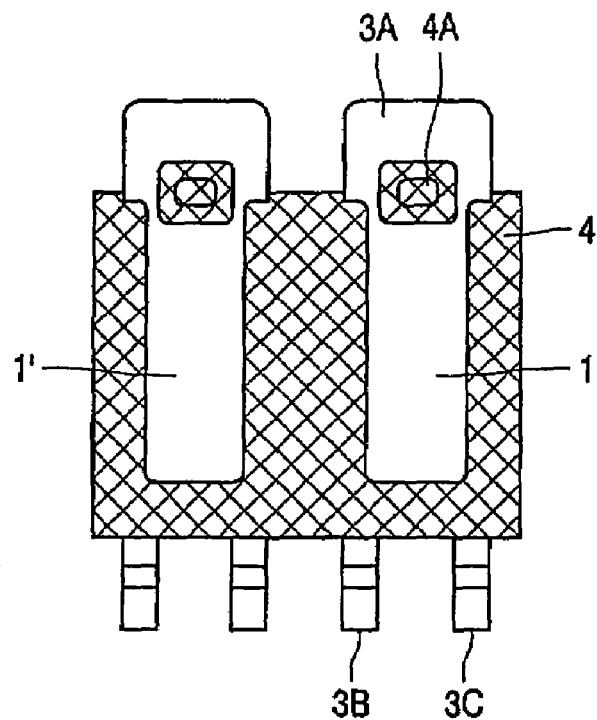
Figure 3:
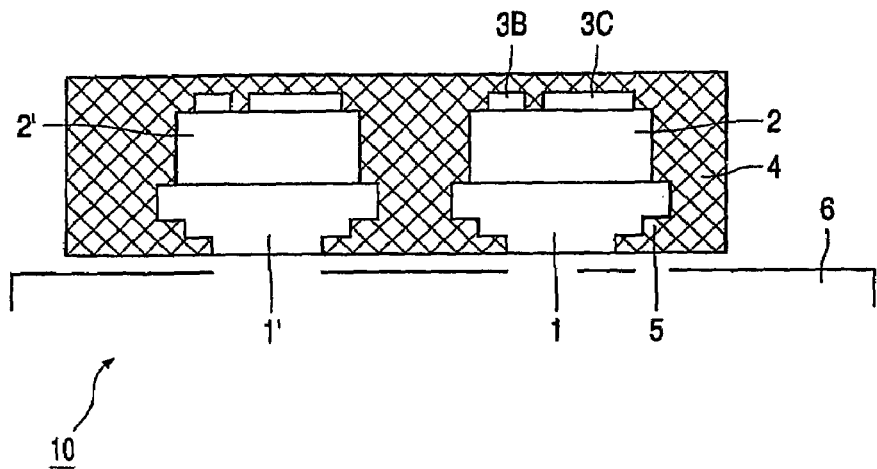
Figure 4:
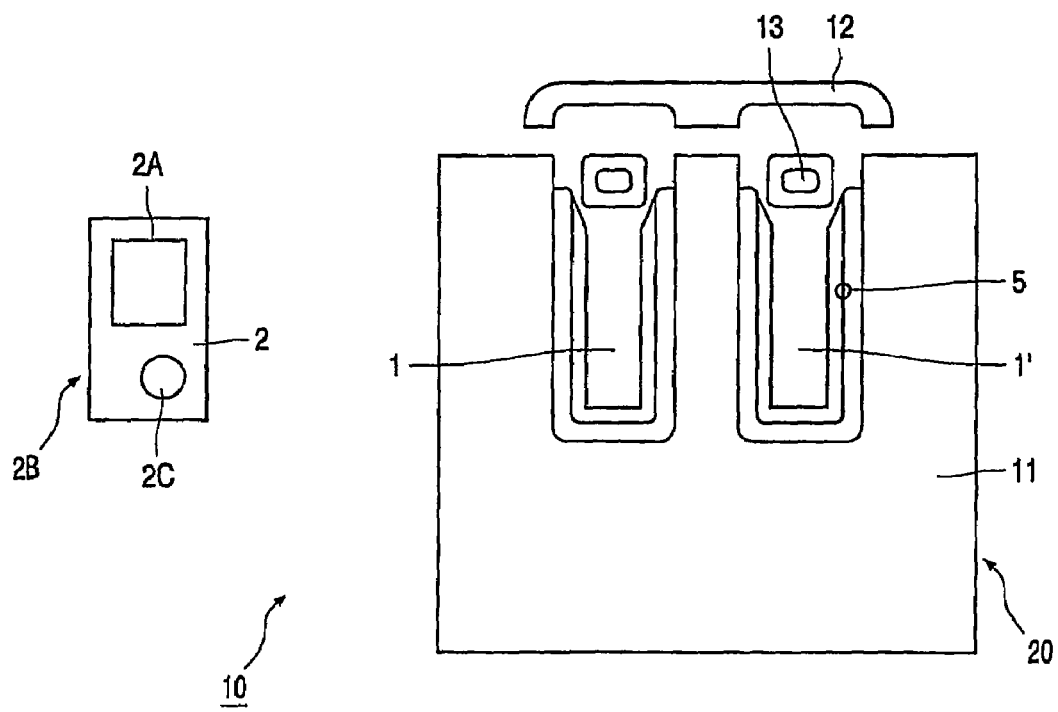
Figure 5:
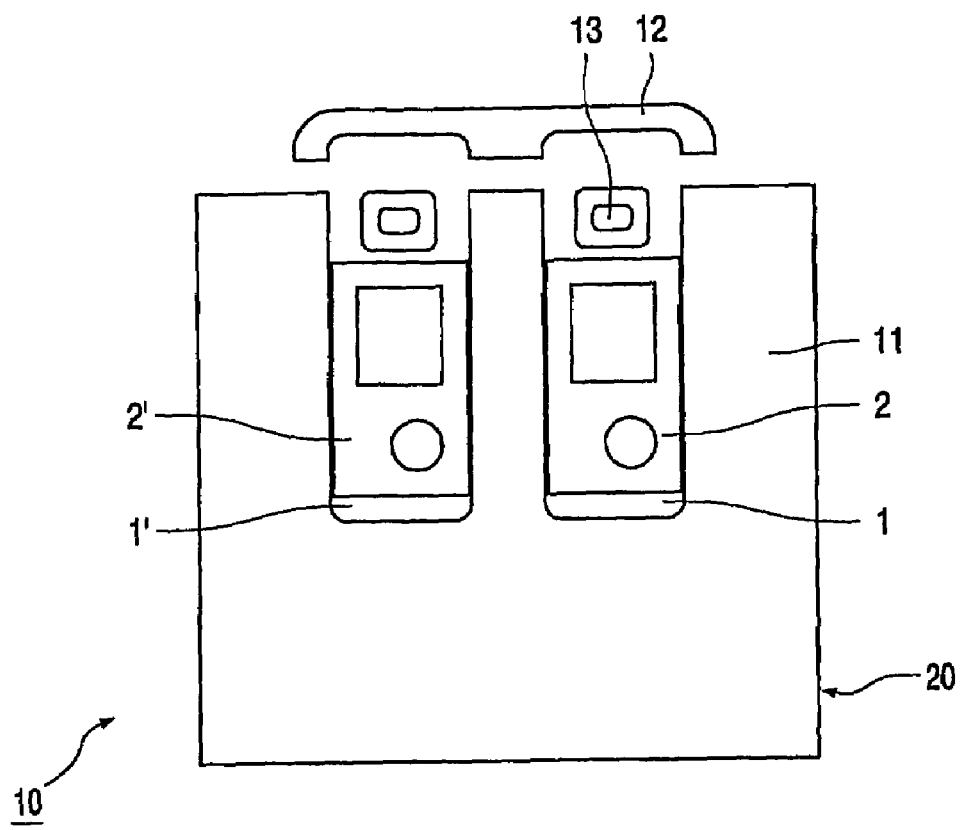

In the drawings:

FIG. 1 is a diagrammatic plan view of an embodiment of a semiconductor device in accordance with the invention, FIG. 2 is a diagrammatic bottom view of the semiconductor device shown in FIG. 1, FIG. 3 is a diagrammatic cross-sectional view at right angles to the thickness direction and taken on the line III-III of the device shown in FIG. 1, and FIGS. 4 to 8 show the device of FIG. 1 in successive stages of the manufacture by means of an embodiment of a method in accordance with the invention.

The figures are not (entirely) on scale, and some dimensions, such as the dimensions in the thickness direction, are exaggerated for clarity. Corresponding areas or parts in the different Figures bear the same reference numerals, whenever possible, and are provided with the same hatching, where applicable.

FIG. 1 is a diagrammatic plan view of an embodiment of a semiconductor device in accordance with the invention. FIG. 2 is a bottom view of the device shown in FIG. 1, and FIG. 3 shows the device of FIG. 1 in a cross-sectional view at right angles to the thickness direction and taken on the line III-III in FIG. 1.

A device 10 comprises a thermally and electrically conductive bottom plate 1 on which a semiconductor element 2 is mounted, in this case a LDMOSFET transistor 2 with three connection regions, i.e. a drain, a source and a gate. The drain is connected to the bottom plate 1 that projects from an envelope 4 and forms a (connection) conductor 3A. Source and gate are provided with, respectively, conductors 3B, 3C, which also project from the envelope 4. In this example, the device comprises two, in this case identical, bottom plates 1, 1' with two, in this case identical, transistors 2, 2'. FIG. 2 and, in particular, FIG. 3 clearly show that the envelope 4 engages the lower side of a side face of the bottom plate 1 by means of a recess 5 that is situated at said location. In this example, the bottom plate 1 has an aperture wherein a part 4A of the envelope 4 is situated.

In accordance with the invention, the recess 5, viewed in cross-section at right angles to an edge of the bottom plate 1, is in the form of a staircase with two steps. The favorable effects thereof are best illustrated with reference to FIG. 3 where the device 10 is situated on a support plate 6 during the provision of the synthetic resin envelope 4. The liquid envelope 4 flows from above and first enters the highest part (at the location of the second step) of the recess 5, where, after the envelope 4 has finally solidified, it firmly anchors to the bottom plate 1. Next, the liquid envelope 4 flows into the lower part (at the location of the first step). Here, the flow rate of the envelope 4 is lower because the resistance is higher. Also the heat content of the envelope 4 is smaller at said location owing to the smaller height dimension and, in addition, the cooling surface is relatively large. As a result of all said factors, the envelope 4 will solidify comparatively rapidly at said location. As a result, it is precluded that a part of the envelope 4 flows into an, inevitable, slit between the support plate 6 and the lower side of the bottom plate 1. By virtue thereof, the bottom plate 1 has a truly flat lower side, which would not be the case if a part of the envelope 4 was present thereon, said truly flat bottom plate enhancing a good heat dissipation after final assembly.

It is to be noted that in the situation where the device 10 to be formed is present on the support plate 6 shown in FIG. 2, said device 10 is further surrounded by a mold, not shown in the drawing, having an aperture through which the liquid envelope 4 is introduced so as to surround the element 2 and a part of the conductors 3 and the bottom plate 1. The mold in fact comprises a further support plate that is situated above the device(s) 10 to be formed.

In this example, the recess 5 has a depth of 0.26 mm and a height of 40 μm at the location of the first step, and a depth of 0.26 mm and a height of 125 μm at the location of the second step. The recess 5, in this example, extends substantially throughout the edge of the two longitudinal sides and an end side of the bottom plate 1. In this case, the bottom plate 1 and the conductors 3 are made of copper. The visible parts thereof (see FIGS. 1 and 2) are provided, by means of electroplating with a Sn layer, not shown in the drawing, to make final assembly easier. The device 10 in accordance with the invention is excellently suited for placement in an SO8 (=Standard Outline 8 pin) foot that is suitable for final assembly on, for example, a PCB.

The device 10 in accordance with the invention is manufactured as follows, using a method in accordance with the invention.

FIGS. 4 through 8 show the device of FIG. 1 in successive stages of the manufacture by means of an embodiment of a method in accordance with the invention. There is started from (see FIG. 4) a bottom conductor frame 20 which is provided with apertures 11, 12, 13. As a result, the bottom plates 1, 1' are substantially non-engaging, but still connected to the frame 20. The aperture 13, which is provided with a one-step profile, causes the bottom plate 1 to be anchored eventually, in the longitudinal direction thereof, to the envelope 4 to be provided. By means of a suitable punch, not shown in the drawing, the edge of the bottom plate 1 is provided, on the lower side shown in FIG. 4, with a recess 5 having the desired profile and the desired dimensions, as explained hereinabove. Next to the bottom frame 20, the semiconductor element 2, here a MOSFET transistor, is shown which is provided on the lower side with a drain connection region 2B and on the upper side with a source connection region 2A and a gate connection region 2C.

Figure 6:
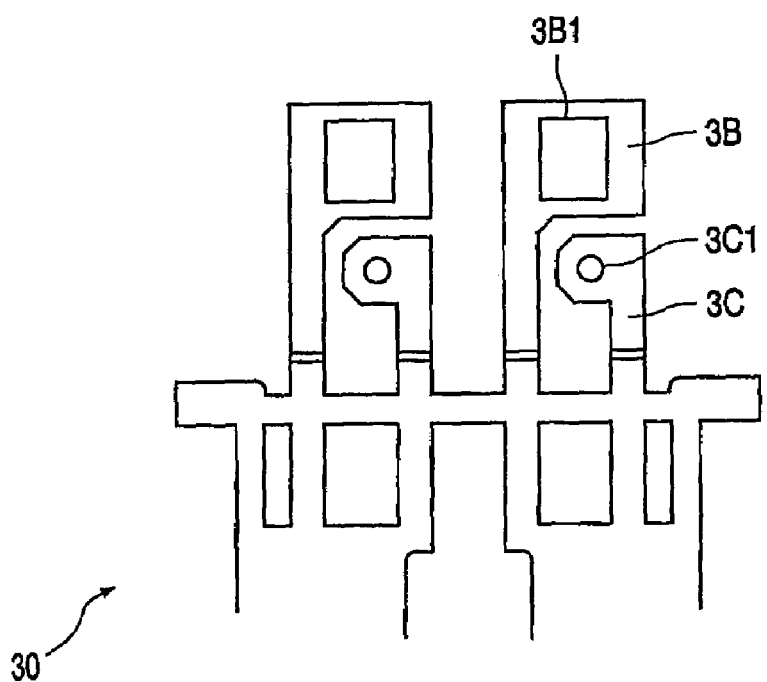

Subsequently (see FIG. 5), the element 2 is soldered onto the bottom plate 1. FIG. 6 shows a second conductor frame 30 which comprises the connection conductors 3B, 3C to be formed of the transistor 2. Parts 3B1, 3C1 of the conductors 3B, 3C have downward bulges to facilitate the soldering of these parts onto the transistor 2. This frame 30 is subsequently soldered onto the device 10 (see FIG. 7), the conductors 3B, 3C forming an electrical and thermal connection of the source 2A and the gate 2B of the transistor 2.

Figure 7:
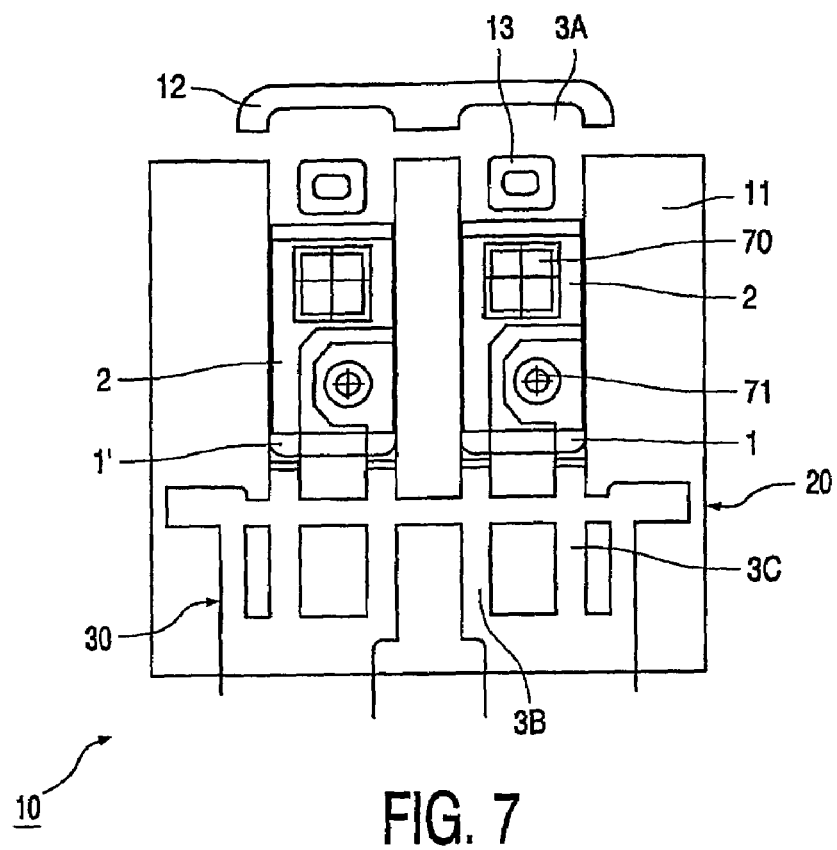
Figure 8:
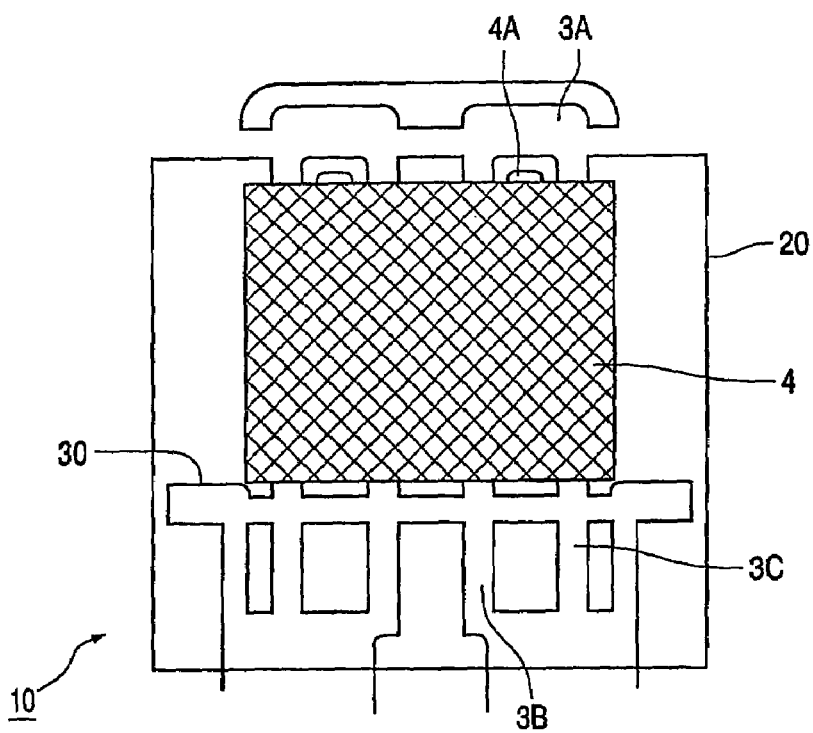

The cross lines 70, 71 in FIG. 7 illustrate only the alignment of the conductor parts 3B1, 3C1 on the source and gate regions 2B, 2C of the transistor 2. It is noted that both the frame 20 and the frame 30 may have a periodic structure in one or two directions, so that a large number of devices 10 can be manufactured simultaneously.

Subsequently (see FIG. 8), the device(s) 10 to be formed is (are) placed in a mold comprising two support plates, after which a liquid epoxy material 4 is pressed between said support plates, which liquid epoxy material forms an envelope 4 of the element 2 and of a part of the conductors 3, said envelope engaging the side face of the bottom plate 1 as described hereinabove and cooling and solidifying in the favorable manner described hereinabove. Finally, superfluous parts of the envelope 4 and the conductor frames 20, 30 are removed, and through singulating by means of sawing, individual devices 10 in accordance with the invention are obtained, as shown in FIG. 1. The device 10 discussed here has the following dimensions. The width is approximately 4.5 mm, the overall length, including projecting parts of the conductors 3, is approximately 5 mm and the thickness is approximately 1 mm. Hence, the device 10 is very compact. In this case, the element 2 has the following dimensions: 1.6 mm×1.8 mm. The bottom plate 1 then has a width of, for example, 1.8 mm.

The invention is not limited to the example described hereinabove because, within the scope of the invention, many variations and modifications are possible to those skilled in the art. For example, devices having a different geometry and/or different dimensions can be manufactured. In particular, the invention can also suitably be used for slightly larger devices, such as the so-termed D-Pack and D$^2$-Pack having a surface area which is, respectively, 2 and 4 times larger than that of the device described in the example. The observations made above regarding the device also apply to the manufacture thereof. For example, instead of sawing use can also be made of a laser beam or a cutting technique.

It is further noted that the device may comprise additional active and passive semiconductor elements or electronic components, such as diodes and/or transistors and resistors and/or capacitors, whether or not in the form of an integrated circuit. The manufacture is of course efficiently adapted thereto.

The invention claimed is:

1. A semiconductor device comprising a thermally and electrically conductive bottom plate on an upper side of which there is a semiconductor element with a first connection region and a second connection region, said regions being coupled to, respectively a first conductor and a second conductor, said semiconductor element being surrounded by an electrically insulating synthetic resin envelope that covers a side face of the bottom plate, which side face is provided with a recess that is filled with a part of the envelope, characterized in that the recess, viewed in cross-section at right angles to an edge of the bottom plate, takes the form of a staircase with at least two steps, wherein a connection region of a drain of the semiconductor element borders on the bottom plate and forms a drain connection that projects from the envelope, and wherein connection regions of a source and a gate of the semiconductor element are situated on a side of the semiconductor element opposite the connection region of the drain, and the first and second conductors form, respectively, source and gate connections that project from the envelope.

2. A semiconductor device as claimed in claim 1, wherein the first and second conductors form an assembly, of which part is coupled to, respectively, the first and second connection regions, said part being surrounded by the electrically insulating synthetic resin envelope.

3. A semiconductor device as claimed in claim 1, characterized in that the height of the recess at the location of the first step lies in the range between 20 and 60 μm and at the location of the second step in the range between 100 and 150 μm, while the width of the steps ranges between 0.2 and 0.4 mm.

4. A semiconductor device as claimed in claim 1, characterized in that the device comprises a further electrically conductive bottom plate that is separated from the bottom plate and on which a further semiconductor element is situated having a first and a second further connection region, said further regions being coupled to, respectively a first further conductor and a second further conductor, said further semiconductor clement being surrounded by the electrically insulating synthetic resin envelope that is connected to the further bottom plate in a way similar to the manner in which it is connected to the bottom plate.

5. A semiconductor device as claimed in claim 4, wherein the first and second further conductors are part of an assembly, of which part is coupled to the further semiconductor element, said part being surrounded by the resin envelope.

6. A semiconductor device as claimed in claim 1, characterized in that the semiconductor element comprises a MOSFET transistor.

7. A method of manufacturing a semiconductor device, comprising the steps of:
    providing an electrically conductive bottom plate having an upper side and a lower side, and a side face, at which side face a recess is present, with its lower side on a support plate;
    securing a semiconductor element on the upper side of the bottom plate, which semiconductor element is provided with a first connection region and a second connection region;
    providing an assembly of a first conductor and a second conductor, such that a part thereof is coupled to, respectively, the first and the second connection region, characterized in that the assembly of conductors and the bottom plate are formed from two conductor frames, one of which comprises the bottom plate and a conductor, and the other one of which comprises another conductor, and after securing the semiconductor element to the bottom plate in one conductor frame, the other conductor frame is secured to the semiconductor element,
    surrounding the semiconductor element and the parts of the conductors coupled thereto by an electrically insulating synthetic resin envelope, such that it covers also the side face of the bottom plate and that it projects above the support plate in the recess, and
    removing the support plate, wherein the recess of the bottom plate has or is given the shape of a staircase with at least two steps, when viewed in a direction transverse and perpendicular to the edge of the bottom plate.

8. A method as claimed in claim 7, wherein the recess is formed by means of a punch technique.

9. A method as claimed in claim 7, characterized in that after the envelope is provided, superfluous parts of the conductor frames are removed.

10. A semiconductor device comprising
    a thermally and electrically conductive bottom plate on an upper side of which there is a semiconductor element with a first connection region and a second connection region, said regions being coupled to, respectively a first conductor and a second conductor, said semiconductor element being surrounded by an electrically insulating synthetic resin envelope that covers a side face of the bottom plate, which side face is provided with a recess that is filled with a part of the envelope, characterized in that the recess, viewed in cross-section at right angles to an edge of the bottom plate, takes the form of a staircase with at least two steps; and
    a further electrically conductive bottom plate that is separated from the bottom plate and on which a further semiconductor clement is situated having a first further connection region and a second further connection region, said further regions being coupled to, respectively a first further conductor and a second further conductor, said further semiconductor element being surrounded by the electrically insulating synthetic resin envelope that is connected to the further bottom plate in a way similar to the manner in which it is connected to the bottom plate.

11. A semiconductor device as claimed in claim 10, wherein the first and second conductors form an assembly, of which part is coupled to, respectively, the first and second connection regions, said part being surrounded by the electrically insulating synthetic resin envelope.

12. A semiconductor device as claimed in claim 10, characterized in that a height of the recess at a location of the first step lies in a range between 20 and 60 μm and at a location of the second step in a range between 100 and 150 m, while a width of the steps ranges between 0.2 and 0.4 mm.

13. A semiconductor device as claimed in claim 10, wherein the first and second further conductors are part of an assembly, of which part is coupled to the further semiconductor element, said part being surrounded by the resin envelope.

14. A semiconductor device as claimed in claim 10, characterized in that the semiconductor element comprises a MOSFET transistor.

15. A semiconductor device as claimed in claim 14, wherein a connection region of a drain of the MOSFET borders on the bottom plate and forms a drain connection that projects from the envelope, and wherein connection regions of a source and a gate of the MOSFET are situated on a side of the MOSFET opposite the connection region of the drain, and the first and second conductors form, respectively, source and gate connections that project from the envelope.

* * * * *